United States Patent
Hara

(10) Patent No.: US 7,375,714 B2
(45) Date of Patent: May 20, 2008

(54) ACTIVE-MATRIX DRIVING DEVICE, ELECTROSTATIC CAPACITANCE DETECTION DEVICE, AND ELECTRONIC EQUIPMENT

(75) Inventor: Hiroyuki Hara, Chino (JP)

(73) Assignee: Seiko Epson Corporation, Tokyo (JP)

( * ) Notice: Subject to any disclaimer, the term of this patent is extended or adjusted under 35 U.S.C. 154(b) by 562 days.

(21) Appl. No.: 10/916,620

(22) Filed: Aug. 12, 2004

(65) Prior Publication Data

US 2005/0083768 A1    Apr. 21, 2005

(30) Foreign Application Priority Data

Sep. 1, 2003  (JP) ............... 2003-308434

(51) Int. Cl.
G09G 3/36    (2006.01)
(52) U.S. Cl. ........................ 345/98; 345/100
(58) Field of Classification Search .......... 345/55, 345/87, 98, 100, 103, 211; 382/124
See application file for complete search history.

(56) References Cited

U.S. PATENT DOCUMENTS

| | | | |
|---|---|---|---|
| 5,883,609 A * | 3/1999 | Asada et al. ............. | 345/100 |
| 6,055,324 A * | 4/2000 | Fujieda ................... | 382/124 |
| 6,141,274 A | 10/2000 | Eto et al. | |
| 6,411,727 B1 | 6/2002 | Harkin | |
| 6,438,257 B1 * | 8/2002 | Morimura et al. ........ | 382/124 |
| 6,681,033 B1 * | 1/2004 | Yano et al. .............. | 382/124 |
| 2001/0033254 A1 * | 10/2001 | Furusato et al. ........ | 345/55 |
| 2002/0041278 A1 * | 4/2002 | Matsueda ................. | 345/204 |
| 2003/0184512 A1 * | 10/2003 | Hayashi et al. ......... | 345/100 |

FOREIGN PATENT DOCUMENTS

JP    A 11-118415    4/1999

(Continued)

OTHER PUBLICATIONS

U.S. Appl. No. 10/808,523, filed Mar. 25, 2004, Hara.

(Continued)

Primary Examiner—Chanh D. Nguyen
Assistant Examiner—Pegeman Karimi
(74) Attorney, Agent, or Firm—Oliff & Berridge, PLC

(57) ABSTRACT

Aspects of the invention are intended to stabilize the initial state of an active matrix so as to reduce unnecessary power consumption and stabilize the operation. The driving device can include a selection device that is coupled to any of a plurality of row direction lines and any of a plurality of column direction lines, and by which a selected state and a non-selected state of the row direction lines or the column direction lines are switched to each other. The driving device can also include a device that switches to the non-selected state that switches the selection device coupled to the row direction lines or the selection device coupled to the column direction lines to a non-selected state. Selection by the selection device can be implemented after the selection device is switched to a non-selected state by the device that switches to the non-selected state.

11 Claims, 7 Drawing Sheets

FOREIGN PATENT DOCUMENTS

| | | |
|---|---|---|
| JP | A 11-312811 | 11/1999 |
| JP | A-2000-21172 | 1/2000 |
| JP | A 2000-346608 | 12/2000 |
| JP | A 2001-56204 | 2/2001 |
| JP | A 2001-133213 | 5/2001 |
| JP | A-2001-523349 | 11/2001 |
| JP | A 2003-254706 | 9/2003 |

OTHER PUBLICATIONS

Utsunomiya et al., "36.2 Low Temperature Poly-Si TFTs on Plastic Substrate Using Surface Free Technology by Laser Ablation/Annealing (SUFTLA™)," SID 00 Digest, pp. 916-919, 2000.

\* cited by examiner

ACTIVE-MATRIX DRIVING DEVICE, ELECTROSTATIC CAPACITANCE DETECTION DEVICE, AND ELECTRONIC EQUIPMENT

BACKGROUND OF THE INVENTION

1. Field of Invention

The invention relates to an active-matrix driving device for driving active elements, such as electrostatic capacitance detection elements arranged in a matrix, an electrostatic capacitance detection device, and electronic equipment that utilize the same.

2. Description of Related Art

In related electrostatic capacitance fingerprint sensors, as disclosed, for example, in Japanese Unexamined Patent Publication No. 11-118415, Japanese Unexamined Patent Publication No. 2000-346608, Japanese Unexamined Patent Publication No. 2001-56204, and Japanese Unexamined Patent Publication No. 2001-133213, a surface of a sensor electrode formed on a substrate is covered with a dielectric film, and an electrostatic capacitance detection circuit that detects electrostatic capacitance formed between a fingertip and the sensor electrode with regarding the potential of the fingertip as a reference potential, is equipped, and thereby recognizing ridges and valleys in a fingerprint. Such related electrostatic capacitance detection circuits can be made up of active elements and are arranged in a matrix, enabling selection of each electrostatic capacitance detection circuit according to the combination of a scan line and a date line. Thereby, ridges and valleys pattern of a fingerprint can be obtained as binary image data.

SUMMARY OF THE INVENTION

However, such an active matrix may involve variation in the potential of data lines and scan lines at the time of, for example, power up. In this case, caused is a disadvantage that, as an initial state, unwanted currents continue to flow in a data line or scan line that was selected unintentionally. In addition, if such variation is caused, stable reading with high reliability also becomes difficult.

Aspects of the invention can be intended to stabilize the initial state of an active matrix so as to reduce unnecessary power consumption and stabilize the operation of a device. An active-matrix driving device of one aspect of the invention can drive an active matrix where a plurality of row direction lines and a plurality of column direction lines are arranged in a manner of intersecting each other, and an active element selected by one of the row direction lines and one of the column direction lines is disposed at each intersection so as to form a matrix. The driving device can include a selection device coupled to any of the plurality of row direction lines or any of the plurality of column direction lines, a selected state and a non-selected state of the row direction lines or the column direction lines being switched to each other, and device for switching to non-selected state that switches the plurality of row direction lines coupled to the selection device or the plurality of column direction lines coupled to the selection device to a non-selected state simultaneously. Selection by the selection device is implemented after the row direction lines coupled to the selection device or the column direction lines coupled to the selection device is switched to a non-selected state by the device for switching to non-selected state.

In the driving device, the selection device preferably can include a switch device switching a conductive state and a non-conductive state between each of the row direction lines or each of the column direction lines and an external circuit, and signal supply device that supplies a signal for switching between a conductive state and a non-conductive state to the switch device. Furthermore, the device for switching to non-selected state preferably controls so that a signal that switches the switch device to a non-conductive state is generated from the signal supply device, so as to switch the switch device to a non-conductive state. In particular, the device for switching to non-selected state preferably supplies a signal that makes the plurality of row direction lines or the plurality of column direction lines be electrically coupled to a potential supply line of a given potential when the device for switching to non-selected state makes the signal supply device produce a signal that switches the switch device to a non-conductive state.

In the driving device, the selection device preferably can include a signal supply device that supplies a selecting signal or a non-selecting signal for each of the row direction lines or each of the column direction lines. Moreover, the device for switching to non-selected state preferably controls so that the non-selecting signal is generated from the signal supply device.

In the driving device, the signal supply device can be preferably made up of a shift register that sequentially switches any of the plurality of row direction lines or any of the plurality of column direction lines to a selected state, and the device for switching to non-selected state preferably eliminates data in the shift register. In particular, the device for switching to non-selected state preferably eliminates the data by supplying a reset signal to each stage of the shift register.

In addition, in the driving device, the device for switching to non-selected state preferably switches both of the row direction lines coupled to the selection device and the column direction lines coupled to the selection device to a non-selected state.

An electrostatic capacitance detection device of another aspect of the invention can read ridges and valleys information of a surface of a target object by a detection signal corresponding to electrostatic capacitance formed between the target object and the electrostatic capacitance detection device. In the electrostatic capacitance detection device, a plurality of row direction lines and a plurality of column direction lines are arranged in a manner of intersecting each other, and an electrostatic capacitance detection circuit that is selected by one of the row direction lines and one of the column direction lines and outputs the detection signal, is disposed at each intersection, so as to form a matrix. The exemplary detection device can include a selection device coupled to any of the plurality of row direction lines or any of the plurality of column direction lines, a selected state and a non-selected state of the row direction lines or the column direction lines being switched to each other, and device for switching to non-selected state that switches the plurality of row direction lines coupled to the selection device or the plurality of column direction lines coupled to the selection device to a non-selected state simultaneously. Selection by the selection device is implemented after the row direction lines coupled to the selection device or the column direction lines coupled to the selection device is switched to a non-selected state by the means for switching to non-selected state.

Electronic equipment of another aspect of the invention can include an active matrix where a plurality of row direction lines and a plurality of column direction lines are arranged in a manner of intersecting each other, and an active element selected by one of the row direction lines and one of the column direction lines is disposed at each intersection, so as to form a matrix. The driving device can include a selection device coupled to any of the plurality of row direction lines or any of the plurality of column direction lines, a selected state and a non-selected state of the row direction lines or the column direction lines being switched to each other, and a device for switching to non-selected state that switches the plurality of row direction lines coupled to the selection device or the plurality of column direction lines coupled to the selection means to a non-selected state simultaneously. Selection by the selection device is implemented after the row direction lines coupled to the selection device or the column direction lines coupled to the selection device is switched to a non-selected state by the device for switching to non-selected state.

The electronic equipment of the invention corresponds to general equipment incorporating an active matrix and a processing device that drives it and implements information processing. For example, in addition to various card media such as an IC card, a cash card, a credit card, and an identification, a personal authentication device in electronic commerce, a room entry/exit controlling device, and an authentication device in a computer terminal device are included.

BRIEF DESCRIPTION OF THE DRAWINGS

The invention will be described with reference to the accompanying drawings, wherein like numerals reference like elements, and wherein.

DETAILED DESCRIPTION OF PREFERRED EMBODIMENTS

Figure 1:
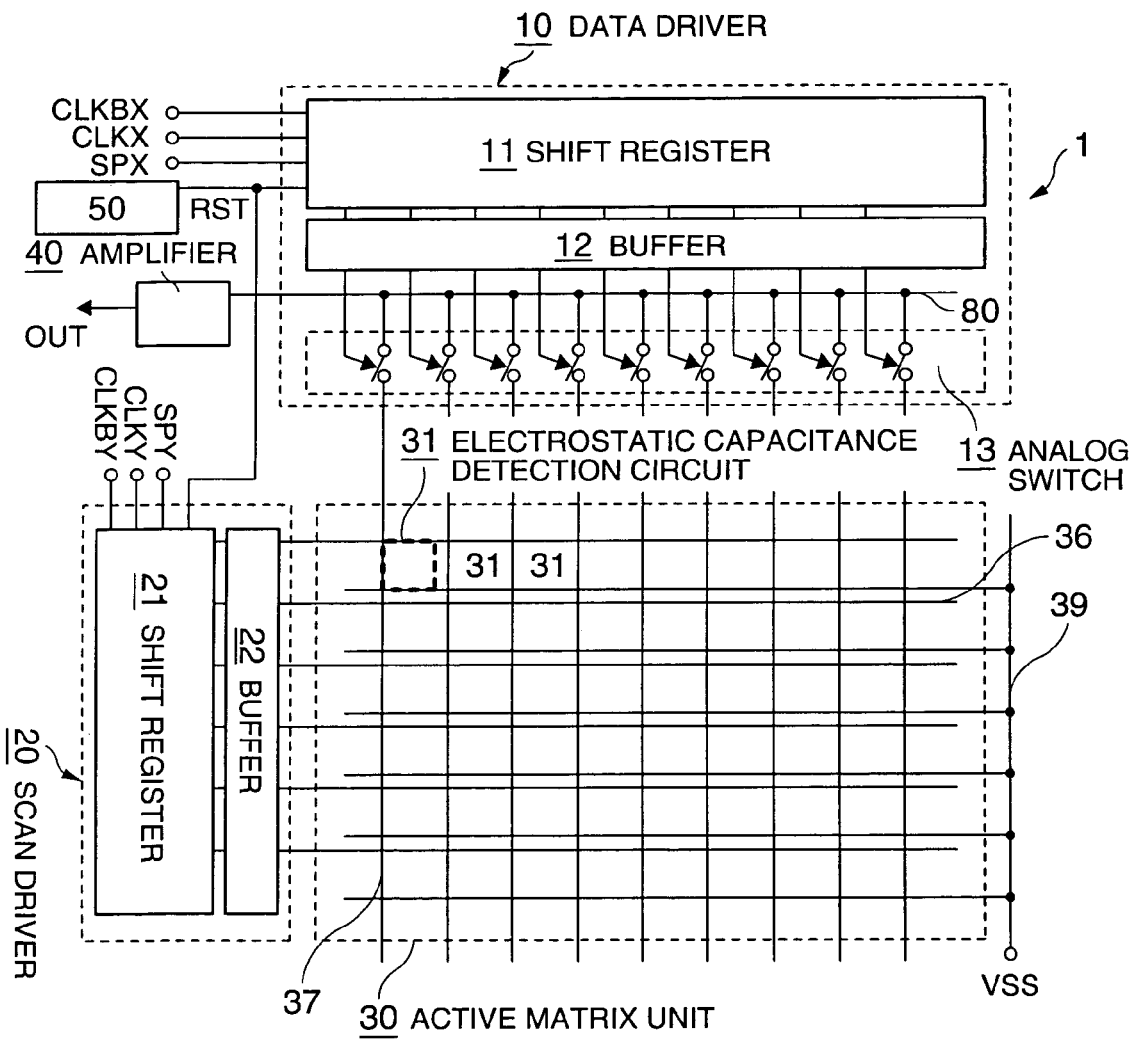
FIG. 1 is an exemplary block diagram of an electrostatic capacitance fingerprint sensor of an exemplary first embodiment.

A preferred first embodiment of the present invention will now be described referring to the drawings.

FIG. 1 is an exemplary block diagram of an electrostatic capacitance fingerprint sensor 1 that is an electrostatic capacitance detection device incorporating electrostatic capacitance detection circuits 31 arranged in a matrix. As shown in the drawing, the fingerprint sensor 1 can include a data driver 10 for selecting data lines 37, a scan driver 20 for selecting scan lines 36, an active matrix unit 30 functioning as a fingerprint detection unit, and an amplifier 40 for amplifying a detection signal.

The data driver 10 can include a shift register 11 that determines the timing of sequentially selecting the data lines 37, a buffer 12, and analog switches 13. The data driver 10 is one aspect of a selection device of the invention. The shift register 11 and the analog switch 13 correspond to signal supply means and switch device of the invention, respectively. A reset signal generator 50, which is device for switching to non-selected state, is coupled to the shift register 11.

The scan driver 20 can include a shift register 21 that determines the timing of sequentially selecting the scan lines 36, and a buffer 22. The scan driver 20 is one aspect of selection device of the invention. The shift register 21 corresponds to signal supply device of the invention. The reset signal generator 50, which is device for switching to a non-selected state, is coupled to the shift register 21.

The electrostatic capacitance detection circuits 31 are arranged in a matrix (M rows×N columns) in the active matrix unit 30. M number of the scan lines 36 and M number of low potential power source lines $V_{SS}$ are arranged along a row direction. N number of the data lines 37 are arranged along a column direction.

In the above structure, when the M number of the scan lines 36 become active by one line, the N number of the data lines 37 existing on one of the scan lines 36 that is active at a certain time are sequentially selected by the analog switches 13 so as to be point-sequentially driven in a manner of coupling to the amplifier 40.

The data driver 10 and the scan driver 20 of the exemplary embodiment can include the shift registers 11 and 21, respectively, and the operation of the registers enables the data lines 37 and the scan lines 36 to be sequentially selected at high speed. In the case of eliminating the variation in potential at the time of power up, however, it is necessary to implement all scanning in a usual shift register such that it takes extra time to start up after power up. In the exemplary embodiment, in order to solve this problem, data in the shift registers can all be eliminated only by applying a reset signal RST to the shift registers 11 and 21.

Figure 2:
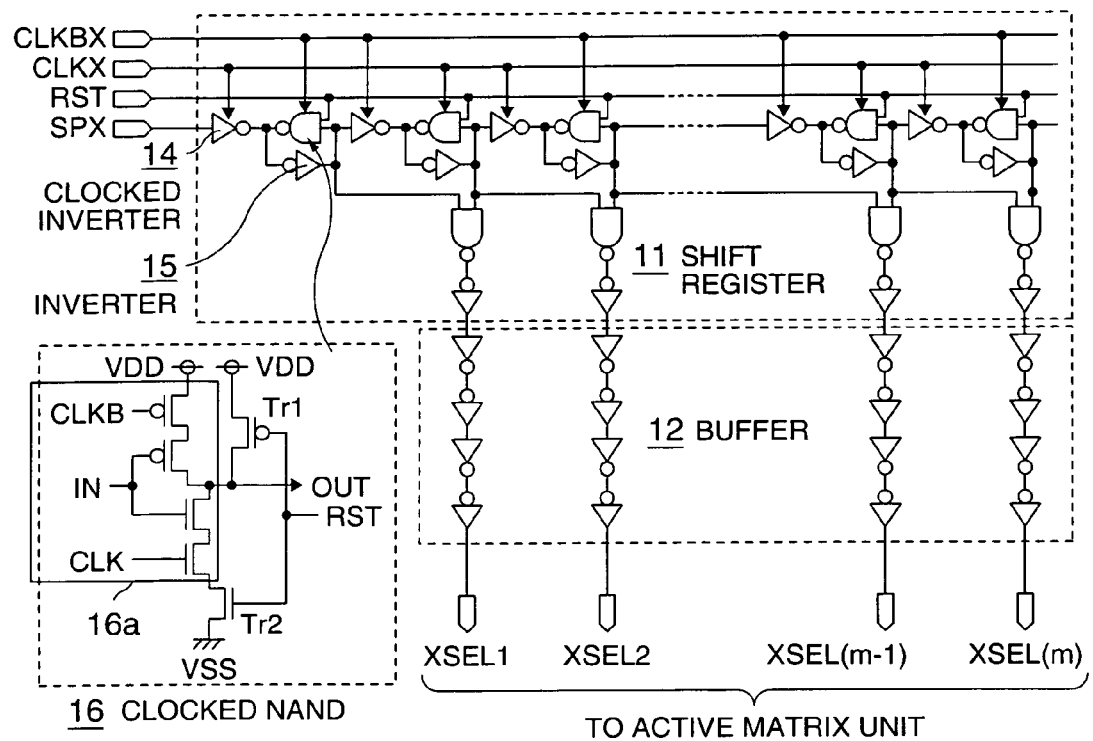
FIG. 2 is an exemplary circuit arrangement diagram of a data driver of the fingerprint sensor.
Figure 3:
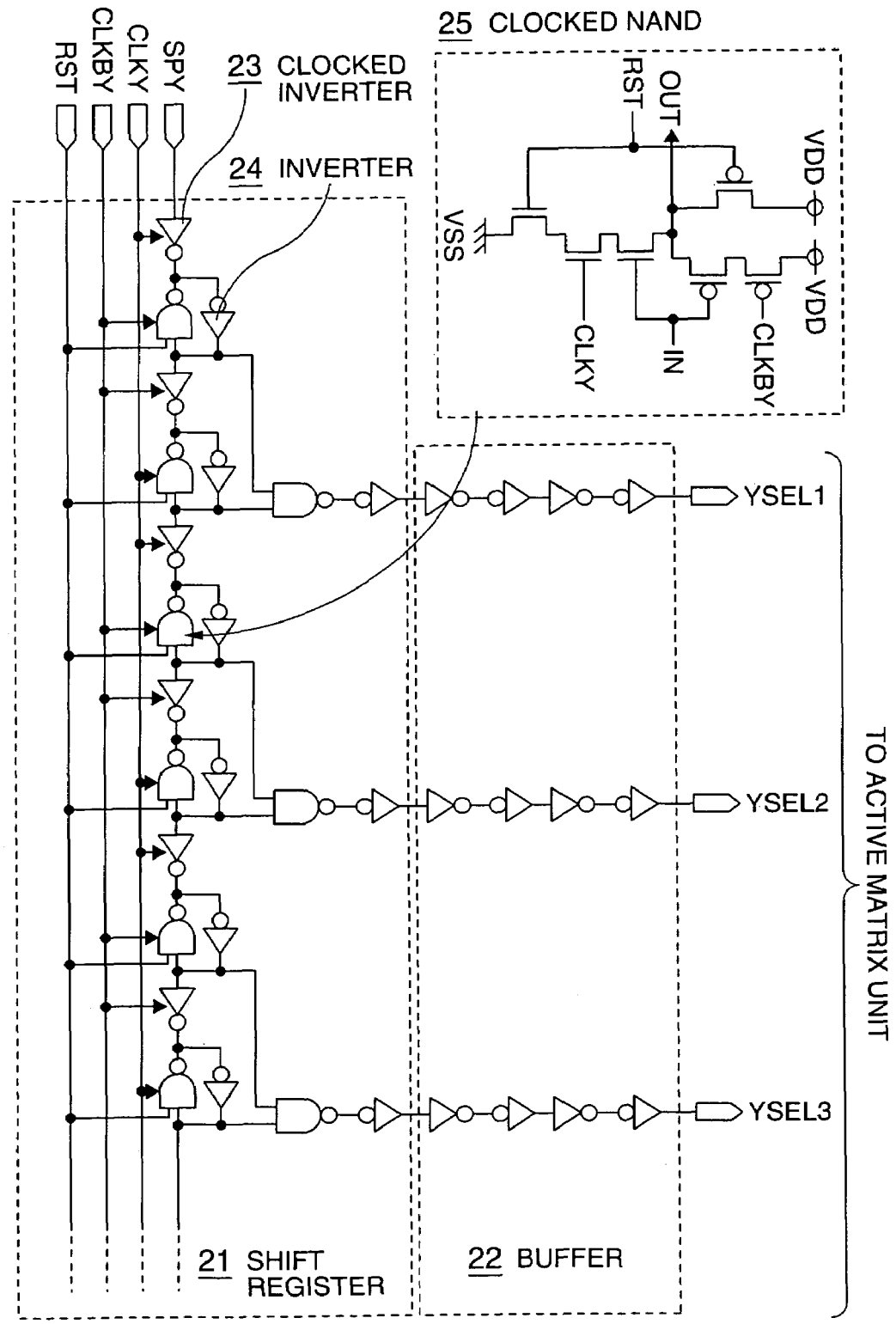
FIG. 3 is an exemplary circuit arrangement diagram of a scan driver of the fingerprint sensor.

FIG. 2 is an exemplary circuit diagram of the data driver 10 used for the above electrostatic capacitance fingerprint sensor. FIG. 3 is an exemplary circuit diagram of the scan driver 20.

In the shift register 11 incorporated in the data driver of FIG. 2, the combinations of a clocked inverter 14, an inverter 15, and a clocked NAND 16 are coupled to each other for a plurality of stages. The clocked inverter 14 controls the reception of data from a previous stage. The inverter 15 inverts an output from the clocked inverter 14. The clocked NAND 16 inverts an output from the inverter 15, i.e., an output to a subsequent stage of the shift register.

The clocked NAND 16 can include a clocked inverter 16a, and reset signal input transistors Tr1 and Tr2 as shown in the circuit arrangement thereof. As input signals to the clocked NAND 16, an RST signal from the reset signal generator 50, and an IN signal from the inverter 15 are input.

When the input signal RST for the clocked NAND 16 is at a level L, the transistor Tr2 becomes non-active, while the transistor Tr1, to which the signal is inverted-input, becomes active, such that the output voltage becomes close to a high potential $V_{DD}$. The clocked NAND 16 therefore outputs a level H regardless of the input signal IN. At this time, since the output H from the clocked NAND 16 is inverted by the inverter 15, data in each stage of the shift register all becomes a level L.

When the input signal RST for the clocked NAND 16 is at a level H, the transistor Tr2 becomes active, while the transistor Tr1, to which the signal is inverted-input, becomes non-active. Thus, the clocked NAND 16 becomes equivalent to a circuit made up only of the clocked inverter 16a, in this case. Accordingly, the shift register 11 operates as a usual shift register.

In the shift register 21 incorporated in the scan driver of FIG. 3, the combinations of a clocked inverter 23, an inverter 24, and a clocked NAND 25 are coupled to each other for a plurality of stages. The clocked inverter 23 controls the reception of data from a previous stage. The inverter 24 inverts an output from the clocked inverter 23. The clocked NAND 25 inverts an output from the inverter 24, i.e., an output to a subsequent stage of the shift register. The function of the shift register 21 is the same as that of the shift register 11 provided in the data driver of FIG. 2.

Figure 4:
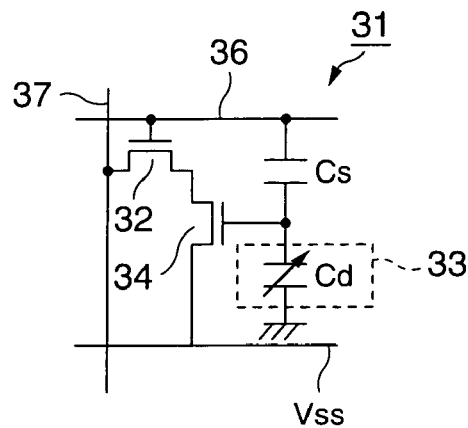
FIG. 4 is an exemplary sectional diagram of the electrostatic capacitance fingerprint sensor of the first exemplary embodiment.

FIG. 4 is an exemplary circuit arrangement diagram of the electrostatic capacitance detection circuit 31 that converts ridges and valleys information of a fingerprint of an examinee to an electrical signal. The detection circuit 31 can include a selection transistor 32 for selecting the detection circuit 31, electrostatic capacitance 33 formed between a fingertip of an examinee and a sensor electrode, and a signal output element 34 that outputs a detection signal assuming ridges and valleys information of a fingerprint based on minute capacitance change of the electrostatic capacitance 33. The detection circuit 31 can include the scan line 36 that transmits a signal for controlling the selection transistor 32 to be open and closed, the data line 37 for transmitting a detection signal, the low potential power source line $V_{SS}$ constituting an output channel for a detection signal, and a reference capacitance Cs with a constant capacitance value. When the capacitance value of the electrostatic capacitance 33 is defined as Cd, the detected capacitance Cd is determined according to the distance between ridges and valleys in a fingerprint of an examinee and a sensor electrode (refer to FIG. 6). As the signal output element 34, although there is no particular limitation if it is an element outputting a detection signal corresponding to the detected capacitance Cd, a signal amplification element (current amplification element) that amplifies a current according to the magnitude of the detected capacitance Cd, or the like is preferable. As such a signal amplification element, in the present embodiment, a three terminal transistor, which has a gate terminal (current control terminal), a source terminal (current output terminal), and a drain terminal (current input terminal), is exemplified. However, it should be understood that a signal amplification element is not limited thereto.

In the above structure, when a signal with logic level H is output to the scan line 36 so as to turn on the selection transistor 32, detection current that is determined according to the gate potential of the signal output element 34 flows in the data line 37. This detection current is processed as a detection signal corresponding to the detected capacitance Cd. Ridges and valleys information of a fingerprint is included in the detection signal. The gate potential of the signal output element 34 is determined according to each capacitance ratio among parasitic capacitance Ct (not shown), the reference capacitance Cs, and the detected capacitance Cd.

For example, in the case where a fingertip of an examinee is brought close to a sensor electrode, when a ridge in a fingerprint comes close to the sensor electrode, the detected capacitance Cd becomes large sufficiently compared to the parasitic capacitance Ct and the reference capacitance Cs such that the gate potential of the signal output element 34 approaches the ground potential. As a result, the signal output element 34 becomes an approximately off state such that an extremely weak current flows between the source and the drain of the signal output element 34. Meanwhile, when a valley in a fingerprint comes close to the sensor electrode, the detected capacitance Cd becomes small sufficiently compared to the parasitic capacitance Ct and the reference capacitance Cs such that the gate potential of the signal output element 34 approaches the potential of the scan line 36. In a state where the scan line 36 is active, the potential of the scan line 36 is the high potential $V_{DD}$. As a result, the signal output element 34 becomes an approximately on state such that a current larger than the above weak current flows between the source and the drain of the signal output element 34. Since the source terminal of the signal output element 34 is coupled to the low potential power source line $V_{SS}$, the direction of a detection current flowing in the signal output element 34 is one from the data line 37 to the low potential power source line $V_{SS}$. Namely, a detection signal assuming ridges and valleys information of a fingerprint of an examinee is output in a manner of flowing from an external circuit into the electrostatic capacitance detection circuit 31. Here, by coupling the source terminal of the signal output element 34 to a high potential power source line, a current may flow along a direction from the electrostatic capacitance detection circuit 31 to the data line 37.

Figure 5:
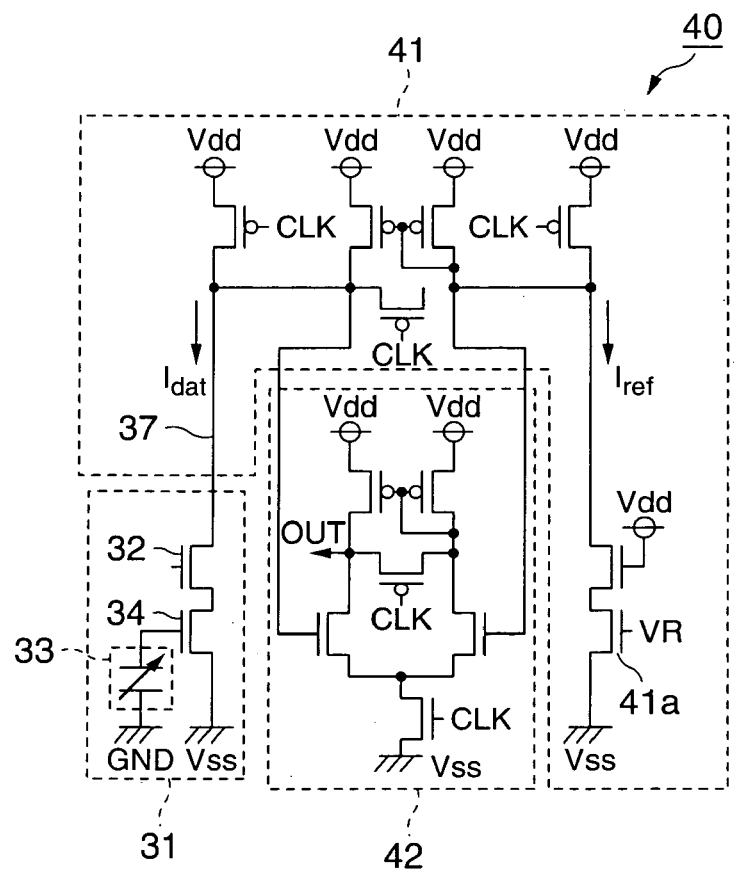
FIG. 5 is an exemplary circuit arrangement diagram of an amplifier of the fingerprint sensor.

FIG. 5 is a circuit arrangement diagram of the amplifier 40 that amplifies a detection signal from the electrostatic capacitance detection circuit 31. The amplification circuit 40 comprises a current mirror circuit 41 at a previous stage and a current mirror circuit 42 at a subsequent stage. The current mirror circuit 41 at a previous stage compares a certain reference current $I_{ref}$ output from a MOS transistor 41a whose gate potential is maintained at a reference voltage VR, with a detection current $I_{dat}$ output from the signal output element 34. The current mirror circuit 42 at a subsequent stage outputs a signal OUT obtained by amplifying the difference between the reference current $I_{ref}$ and the detection current $I_{dat}$. The reference current $I_{ref}$ is previously set to be approximately intermediate value between the maximum and minimum value of the detection current $I_{dat}$. By comparing a given threshold value determined previously with the signal level of the signal OUT, fingerprint information made up of binary data can be obtained.

In the same diagram, a CLK signal is the same as a pulse signal input to the shift register 11, and is synchronized with the switching timing of the analog switch 13.

Figure 6:
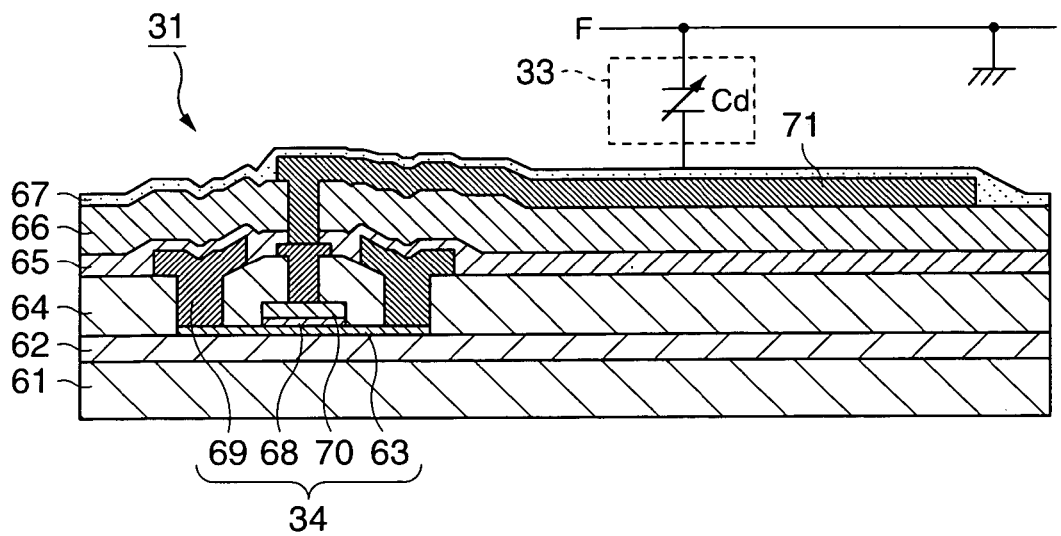
FIG. 6 is an exemplary sectional structure diagram of an electrostatic capacitance detection circuit 31.

FIG. 6 is a sectional structure diagram of the electrostatic capacitance detection circuit 31 around a sensor electrode. As shown in the drawing, in the electrostatic capacitance detection circuit 31, the signal output element 34 that outputs a detection signal assuming ridges and valleys information of a fingerprint, and a sensor electrode (detection electrode) 71 for forming the electrostatic capacitance 33 between the sensor electrode 71 and a fingertip F of an examinee, are formed. The signal output element 34 is a MOS transistor comprising a gate electrode 70, a gate insulating film 68, a poly-silicon layer 63, and a source and drain electrode 69. The electrostatic capacitance 33 is variable capacitance whose capacitance value changes according to ridges and valleys pattern of a fingerprint. The potential of the fingertip F is set to be at a reference potential. The sensor electrode 71 is coupled to the gate electrode 70 so as to transmit the change of the detected capacitance Cd due to ridges and valleys in a fingerprint to the signal output sensor 34, enabling the sensing of an electrostatic capacitance change by utilizing the operation of amplifying a drain current flowing in a channel.

In order to manufacture the electrostatic capacitance detection circuit 31 shown in the same drawing, an underlayer insulating film 62 of silicon oxide and so forth is deposited on an insulating substrate 61, and then amorphous silicon is deposited thereon and is crystallized so as to form the poly-silicon layer 63. Subsequently, a gate insulating film 68 is formed on the poly-silicon layer 63, and the gate electrode 70 is formed on the gate insulating film 68. Then, an impurity is implanted into the poly-silicon layer 63 in a self-aligned manner and is diffused therein so as to form the source and drain region. Next, a first interlayer insulating film 64 is formed, and thereafter contact holes are opened therein so as to form the source and drain electrode 69. Moreover, second interlayer insulating films 65 and 66 are deposited and contact holes are opened therein so as to form the sensor electrode 71. Finally, the whole of the surface is covered with a passivation film 67. Here, the second interlayer insulating films 65 and 66 form the double-layer structure in order to secure flatness with the second interlayer insulating film 65, which is the under layer, and obtain desired film thickness with the second interlayer insulating film 66, which is the upper layer. However, the interlayer insulating film may have a mono layer structure.

It should be understood that a method of forming a semiconductor element, such as a transistor on the insulating substrate 61, is not limited to the above manufacturing method. For example, by applying an ablation and transfer technique that has been disclosed in Japanese Unexamined Patent Publication No. 11-312811 and "S. Utsunomiya et. al. Society for Information Display p. 916 (2000)", a semiconductor element such as a transistor may be formed on the insulating substrate 61. If the ablation and transfer technique is applied, a plastic substrate, a glass substrate, and so forth, which have appropriate strength and are inexpensive, can be used as the insulating substrate 61 such that the mechanical strength of the electrostatic capacitance fingerprint sensor 1 can be enhanced.

Figure 7:
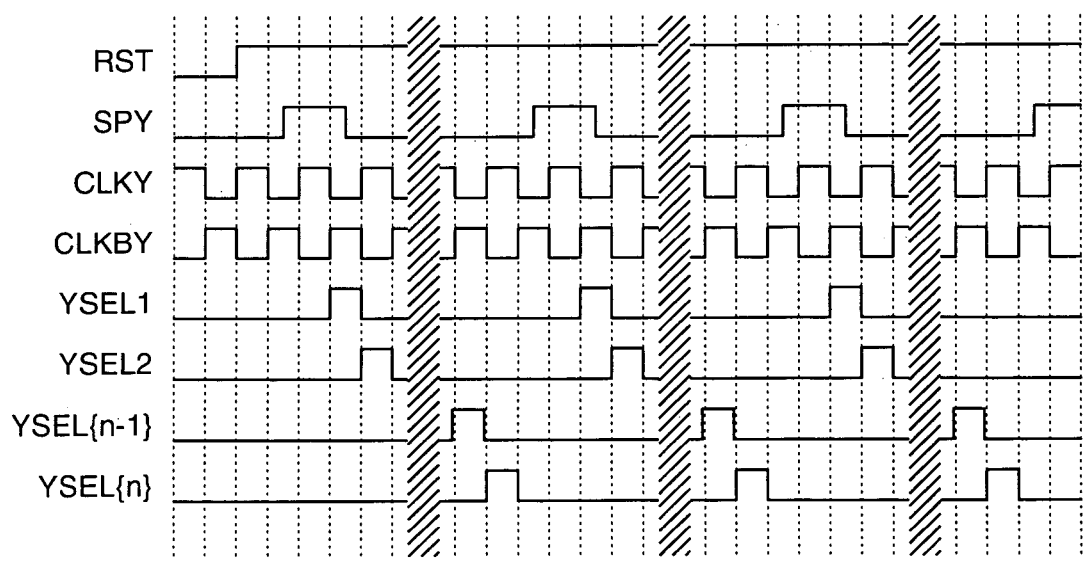
FIG. 7 is a timing chart with respect to the scan driver of the fingerprint sensor.

Next, the driving in the fingerprint sensor 1 during non-operation immediately after power up will be described below. FIG. 7 is a timing chart with respect to the scan driver 20. In the scan driver, the reset signal RST is set to be at a level L immediately after power up. This allows the outputs of all clocked NANDs 25 included in the shift register 21 constituting the scan driver 20 to become a level H. As a result, the outputs from the stages of the shift register all become a level L. This makes all potentials of the scan lines 36 become a level L. Thus, the selection transistors 32 that control the coupling between the data lines 37 and each electrostatic capacitance detection circuit 31 all become non-active. The completion of the reset operation allows an unnecessary initial current to be restrained, enabling subsequent stable operation.

When the reset signal RST is set to be at a level H, the shift register 21 constituting the scan driver 20 performs normal operation. Namely, based on a clock signal CLKY, the signals of a start pulse SPY are sequentially transferred. As a result, the scan lines 36 are selected one by one so as to perform fingerprint detecting operation.

Similarly, in the data driver 10 also, the reset signal RST is set to be at a level L immediately after power up. This allows the outputs of all clocked NANDs 16 included in the shift register 11 constituting the data driver 10 to become a level H. As a result, the outputs from the stages of the shift register all become a level L. This makes all analog switches 13 controlling the coupling between a global data line 80 and each data line 37 become non-conductive. The completion of the reset operation allows an unnecessary initial current to be restrained, enabling subsequent stable operation.

When the reset signal RST is set to be at a level H, the shift register 11 constituting the data driver 10 performs normal operation so as to obtain the data of each electrostatic capacitance detection circuit 31 by sequentially turning on the analog switches 13 coupled to the data lines 37, implementing fingerprint detection operation.

Figure 8:
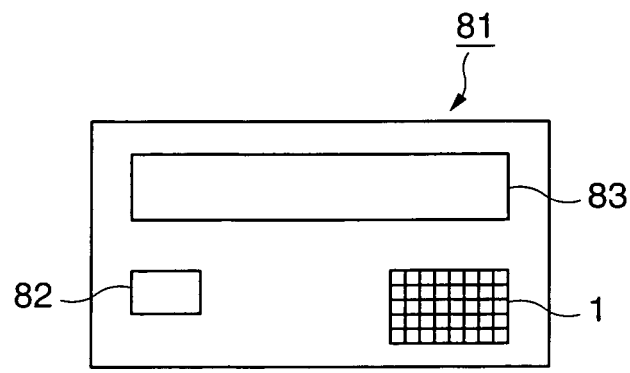
FIG. 8 shows an example of an application into which the electrostatic capacitance fingerprint sensor of the first embodiment is incorporated.

Next, an application of the electrostatic capacitance fingerprint sensor 1 will be described. FIG. 8 shows an exemplary block diagram of a smart card 81. The smart card 81 can include the electrostatic capacitance fingerprint sensor 1 described above, an IC chip 82 that incorporates a CPU, a memory element, and so forth mounted therein, and a display 83 such as a liquid crystal display. In the IC chip 82, the fingerprint information of a card owner is registered as biometrics information.

Figure 9:
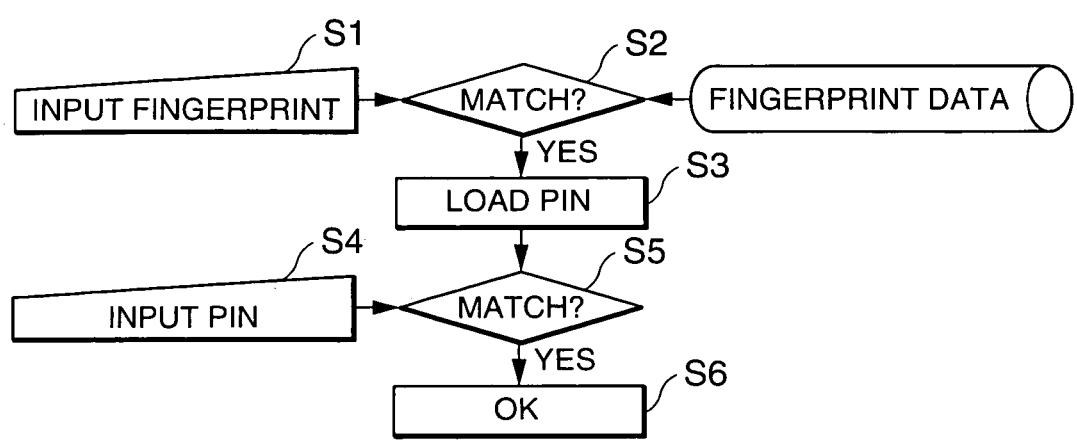
FIG. 9 is a flow chart showing authentication procedures of the first embodiment.

FIG. 9 shows authetication procedures in the smart card 81. When a card owner brings his/her fingertip into contact with the fingerprint sensor 1 so as to input the fingerprint information to the smart card 81 (step S1), this fingerprint information is checked with fingerprint information registered previously (step S2). If the fingerprints match each other (step S2; YES), a personal identification number (PIN) is loaded (step S3). Next, the card owner inputs a PIN (step S4). Whether the PIN loaded in the step S3 and the PIN input in the step S4 match each other or not, is checked (step S5), and then if the both match each other (step S5; YES), the use of the card is allowed (step S6).

As described, since a person is authenticated with finger print information in addition to a PIN, a smart card with high security can be provided. A smart card incorporating a biometrics authentication function is applicable to a cash card, a credit card, an identification, and so forth. The fingerprint sensor of the exemplary embodiment can be applied to all kinds of biometrics authentication devices for personal authentication. For example, the fingerprint sensor is also applicable to a security system for checking a person entering or leaving a room. In this system, the fingerprint sensor of the exemplary embodiment is provided at a door. Then, the fingerprint information of a person to enter a room that is input to the fingerprint sensor is checked with fingerprint information registered previously. Entering is allowed if the both match each other, while if the both do not match each other, entering is not allowed and an alert to a security company and so fourth is made according to need. In addition, also in electronic commerce on open network such as the Internet, the fingerprint sensor of the exemplary embodiment can be applied as a biometrics authentication device for personal authentication effectively. Moreover, the fingerprint sensor can widely be applied to a user authentication device of a computer terminal device, a device for checking a user in a copying machine, and so forth.

In the above description, a fingerprint sensor is exemplified as an embodiment of an electrostatic capacitance detection device of the present invention. However, the present invention is not limited thereto but can be applied to a device that reads out a micro ridges and valleys pattern of any target object as an electrostatic capacitance change. For example, it is applicable to recognition of a muzzle print of an animal.

Figure 10:
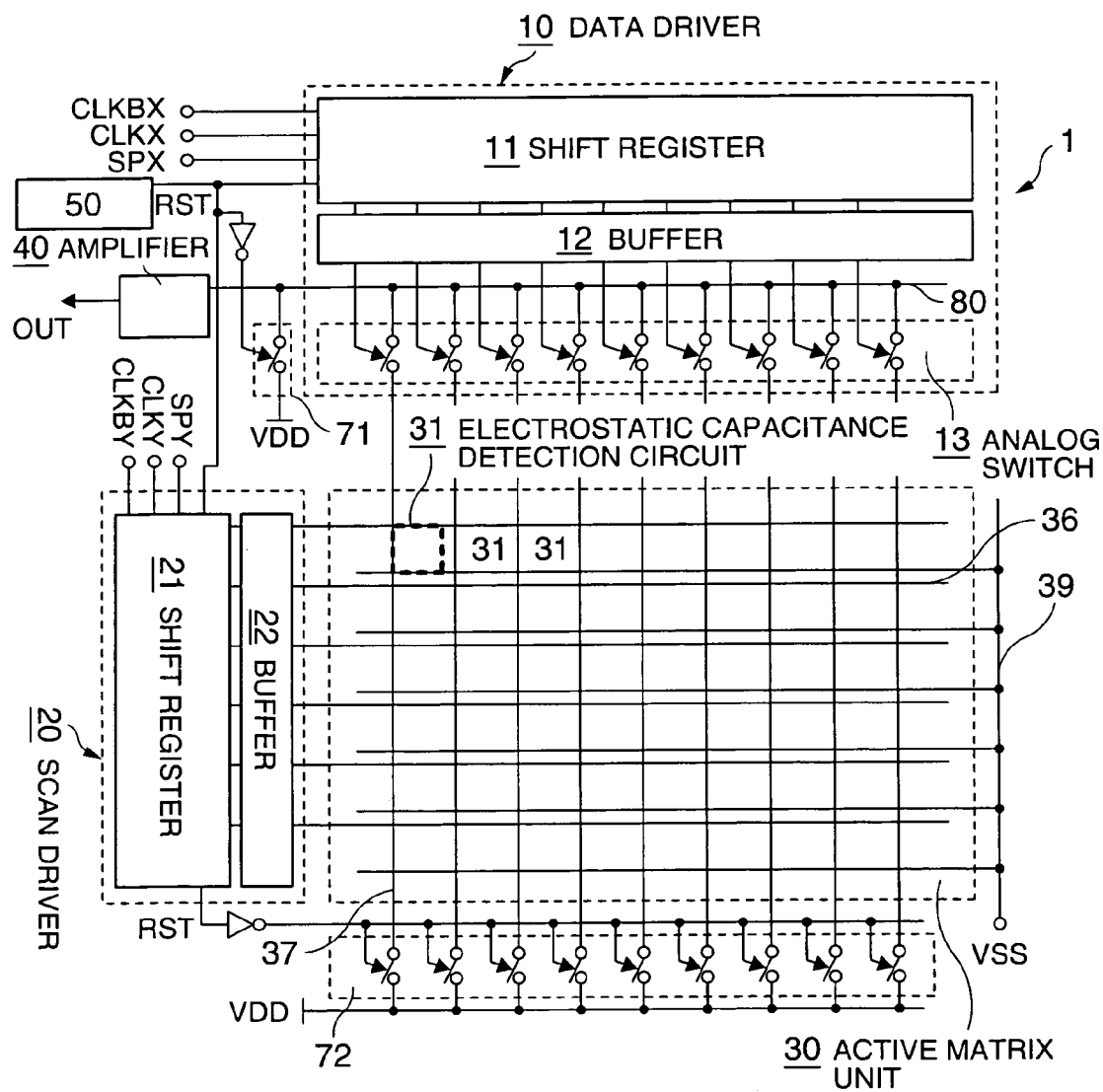
FIG. 10 is an exemplary block diagram of an electrostatic capacitance fingerprint sensor of an exemplary second embodiment.

FIG. 10 is an exemplary block diagram of the electrostatic capacitance fingerprint sensor 1 according to a second exemplary embodiment of the invention. As shown in the drawing, the fingerprint sensor 1 can include the data driver 10 for selecting the data lines 37, the scan driver 20 for selecting the scan lines 36, the active matrix unit 30 as a fingerprint detection region, and the amplifier 40 for amplifying a detection signal. The data driver 10 include the shift register 11 that determines the timing of sequentially selecting the data lines 37.

The data lines 37 are integrated with the global data line 80 for coupling the data lines 37 with the amplifier 40. For the global data (GD) line 80, a GD line precharge switch 71 that controls the coupling with a high potential $V_{DD}$ is provided. For each data line 37, a data line precharge switch 72 that controls the coupling with a high potential $V_{DD}$ is provided.

The scan driver 20 can include a shift register 21 that determines the timing of sequentially selecting the scan lines 36. The electrostatic capacitance detection circuits 31 are arranged in a matrix (M rows×N columns) in the active matrix unit 30. M number of the scan lines 36 and M number of the low potential power source lines $V_{SS}$ are arranged along a row direction. N number of the data lines 37 are arranged along a column direction.

The circuit arrangements of the data driver 10, the scan driver 20, the electrostatic capacitance detection circuit 31, and the amplifier 40 are the same as those in the first exemplary embodiment.

Next, the operation of the fingerprint sensor according to the present embodiment will be described. During non-operation immediately after power up, as described in the first exemplary embodiment, the reset signal RST is made be at a level L immediately after power up. Thereby, the output from each stage of the shift register constituting the data driver 10 and the scan driver 20 becomes a level L such that both of the scan lines and data lines become non-selected state.

At the time of the reset, the reset signal RST is inverted-input to the GD line precharge switch 71 that controls the coupling between the global data line 80 and the VDD level. The GD line precharge switch 71 therefore becomes an ON state such that the global data line 80 is pre-charged to the VDD level.

Similarly, the reset signal RST is inverted-input to the data line precharge switches 72 that control the coupling between each data line 37 and the VDD level. The data line precharge switch 72 therefore becomes an ON state such that all data lines 37 are pre-charged to the VDD level.

In the embodiment, since all scan lines 36 are in a non-selected state at the time of reset operation, the selection transistor 32 of each electrostatic capacitance detection circuit 31 is at an OFF state such that the signal output element 34 is cut off from the data line 37.

By performing the precharge operation for the data line 37 in the preliminary step of sensing in this manner, the potential of the data line 37 at the time of sensing can be stabilized such that operation margin can be widened. Furthermore, since the potential of the data line 37 is stabilized, fingerprint information can be detected at higher speed.

Normal operation of fingerprint detection in the second embodiment is the same as the first embodiment. Here, since the reset signal RST is at a level H at the time of normal operation of fingerprint detection, both of the GD line precharge switch 71 and the data line precharge switch 72 are in a OFF state.

Meanwhile, supply voltage for precharge is not limited to $V_{DD}$, and any voltage can be used.

While this invention has been described in conjunction with the specific embodiments thereof, it is evident that many alternatives, modifications, and variations will be apparent to those skilled in the art. Accordingly, preferred embodiments of the invention as set forth herein are intended to be illustrative, not limiting. There are changes that may be made without departing from the spirit and scope of the invention.

What is claimed is:

1. A driving device comprising:
   a clocked NAND including a first reset signal input transistor, a second reset signal input transistor, and a first clocked inverter, a first electrode of the first reset signal input transistor being electrically connected to a voltage VDD, a second electrode of the first reset signal input transistor being electrically connected to an output terminal of the clocked NAND;
   a clock line CLKBX line configured to provide a clock signal CLKBX to the first clocked inverter;
   a clock line CLKX configured to provide a clock signal CLKX signal to the first clocked inverter; and
   a reset line RST configured to provide a reset signal RST to a gate electrode of the first reset signal input transistor and a gate electrode of the second reset signal input transistor, the first reset signal input transistor being active when the reset signal RST is at low level, the second reset signal input transistor being non-active when the reset signal RST is at low level, and an output voltage from the output terminal of the clocked NAND being at high level when the reset signal RST is at low level.

2. The driving device according to claim 1, further comprising:
   an inverter configured to provide an inverter signal IN to the clocked inverter of the clocked NAND, the inverter changes the level of the output voltage from high level to low level when the reset signal RST is at low level.

3. The driving device according to claim 2, further comprising:
   a second clocked inverter configured to be coupled to the clocked NAND and the inverter to compose one stage of a shift register.

4. The driving device according to claim 1, the output voltage generated from the clocked NAND being at high level regardless of level of the input inverter signal IN when the reset signal RST is at low level.

5. The driving device according to claim 1, the first reset signal input transistor being non-active when the reset signal RST is at high level, the second reset signal input transistor being active when the reset signal RST is at high level.

6. The driving device according to claim 1, further comprising:
   a driving device line SPX configured to provide a driving device signal SPX to the second clocked inverter.

7. The driving device according to claim 1, further comprising:
   a reset signal generator configured to provide the reset signal RST to the clocked NAND via the reset line RST.

8. An active matrix device including the driving device according to claim 1, comprising:
   a shift register having a plurality of stages, each of the plurality of stages including the clocked NAND and the inverter according to claim 1;
   a plurality of data lines configured such that the shift register controlled the plurality of data lines; and
   a plurality of scan lines intersecting the plurality of data lines.

9. The active matrix device according to claim 8, comprising:
 a plurality of electrostatic capacitance detection circuits disposed corresponding to a plurality of intersections between the plurality of data lines and the plurality of scan lines.

10. The active matrix device according to claim 9, comprising:
 an amplification circuit configured to amplify a plurality of detection signals from the plurality of electrostatic capacitance detection circuits.

11. The active matrix device according to claim 10, the amplification circuit including a current mirror circuit.

* * * * *